United States Patent
Chan

(10) Patent No.: US 8,068,319 B1
(45) Date of Patent: Nov. 29, 2011

(54) CIRCUITS, SYSTEMS, ALGORITHMS AND METHODS FOR ESD PROTECTION

(75) Inventor: Ying Poh Chan, Seri Kembangan (MY)

(73) Assignee: Marvell International Ltd., Hamilton (BM)

( * ) Notice: Subject to any disclaimer, the term of this patent is extended or adjusted under 35 U.S.C. 154(b) by 340 days.

(21) Appl. No.: 11/900,972

(22) Filed: Sep. 14, 2007

Related U.S. Application Data

(60) Provisional application No. 60/825,657, filed on Sep. 14, 2006.

(51) Int. Cl.
*H02H 9/00* (2006.01)
(52) U.S. Cl. .................................. 361/56; 361/111
(58) Field of Classification Search ............. 361/56, 361/111
See application file for complete search history.

(56) References Cited

U.S. PATENT DOCUMENTS

| | | | |
|---|---|---|---|
| 6,876,233 B1 * | 4/2005 | Bernardson | 327/98 |
| 6,947,267 B2 * | 9/2005 | Liu et al. | 361/56 |
| 7,064,358 B2 * | 6/2006 | Manna et al. | 257/173 |
| 7,087,968 B1 * | 8/2006 | Lai et al. | 257/355 |
| 7,106,562 B2 * | 9/2006 | Kitagawa | 361/56 |
| 7,245,467 B2 * | 7/2007 | Yeh et al. | 361/56 |
| 2004/0109270 A1 * | 6/2004 | Stockinger et al. | 361/56 |
| 2004/0141269 A1 * | 7/2004 | Kitagawa | 361/56 |
| 2005/0068702 A1 * | 3/2005 | Connor et al. | 361/56 |

* cited by examiner

*Primary Examiner* — Rexford Barnie
*Assistant Examiner* — Tien Mai

(57) ABSTRACT

Circuits, systems, and methods for protecting an integrated circuit having independently-powered circuit sections from electrostatic discharge events. The integrated circuit generally comprises an ESD control line, a first circuit having a first electrostatic discharge (ESD) device coupled to a first positive voltage rail, a first negative voltage rail, and the ESD control line, the first ESD device configured to activate an ESD control signal on the ESD control line when an electrostatic discharge occurs, and a second circuit having a second positive voltage rail, a second negative voltage rail, and a second ESD device, coupled to the second positive voltage rail, the second negative voltage rail, and the ESD control line, the second ESD device configured to shunt current between the second positive voltage rail and the second negative voltage rail when the ESD control signal is activated. The present invention advantageously protects integrated circuits having independently-powered circuit sections from electrostatic discharge events without adding redundant power and/or ground pads by sharing ESD shunting capacity between circuit sections during an ESD event.

21 Claims, 13 Drawing Sheets

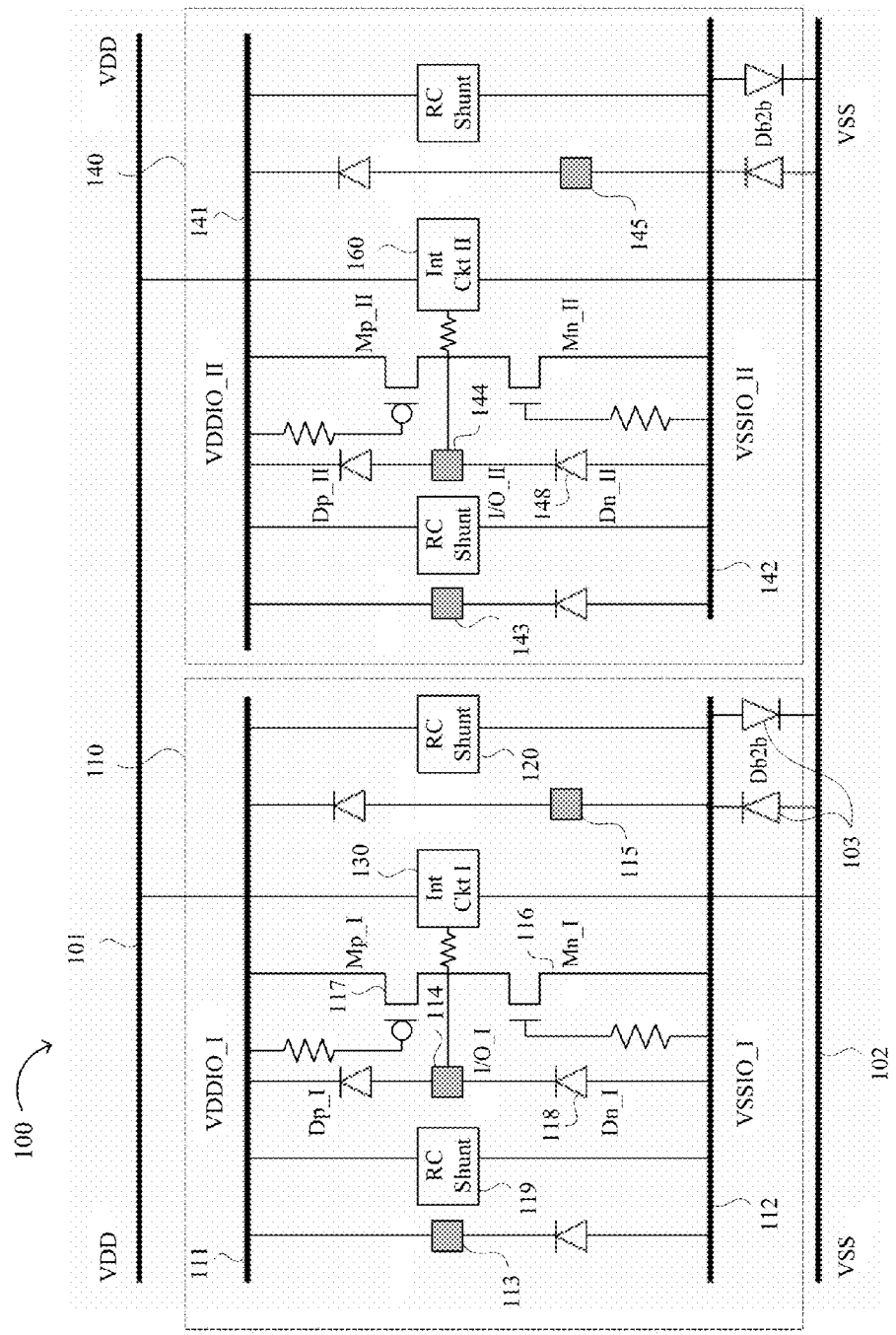
FIG. 1
(Conventional)

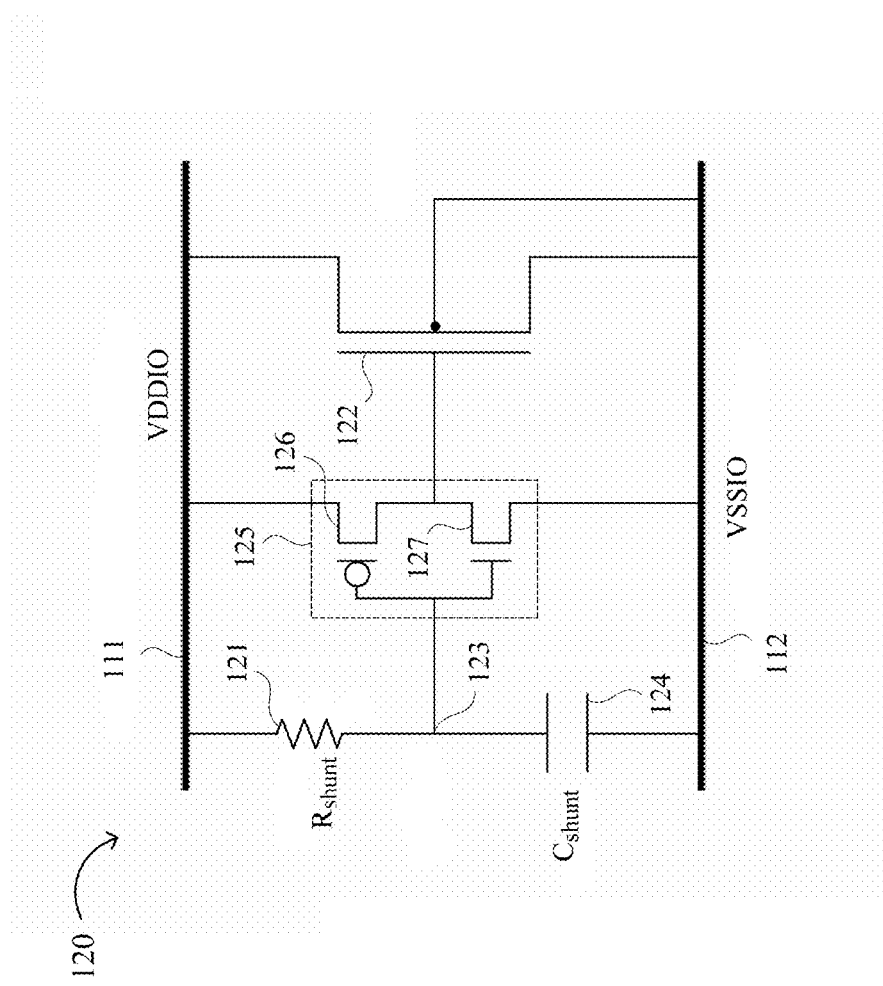
FIG. 2
(Conventional)

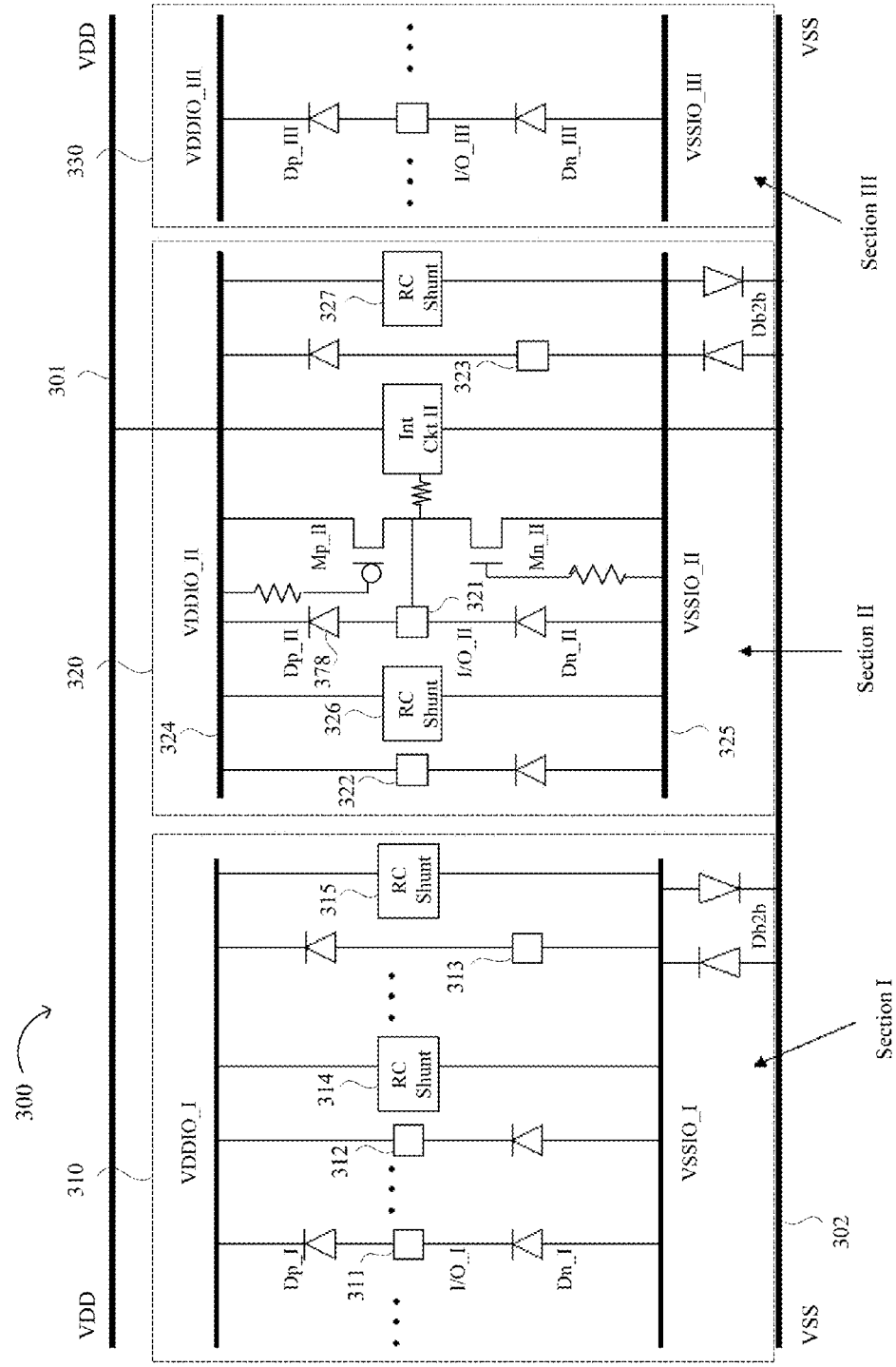
FIG. 3
(Conventional)

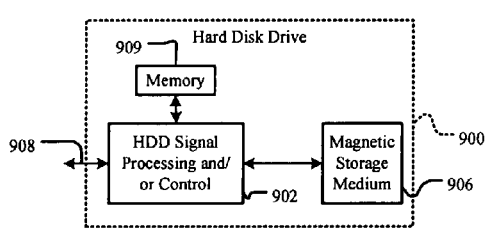
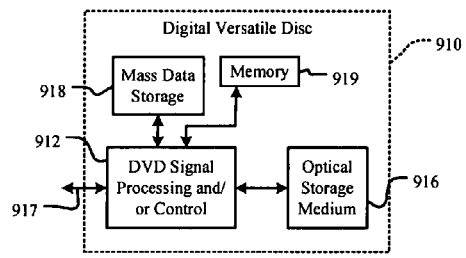
FIG. 8A
FIG. 8B

US 8,068,319 B1

CIRCUITS, SYSTEMS, ALGORITHMS AND METHODS FOR ESD PROTECTION

RELATED APPLICATIONS

This application claims the benefit of U.S. Provisional Application No. 60/825,657, filed Sep. 14, 2006, incorporated herein by reference in its entirety.

FIELD OF THE INVENTION

The present invention generally relates to the field of electrostatic discharge protection. More specifically, embodiments of the present invention pertain to circuits, systems, and methods for protecting an integrated circuit having independently-powered circuit sections from electrostatic discharge events.

DISCUSSION OF THE BACKGROUND

It is generally recognized that integrated circuits are susceptible to damage from electrostatic discharge (ESD). Such damage generally occurs when current and/or voltage ratings of devices in an integrated circuit are exceeded. Progress in VLSI technology today has resulted in smaller and smaller integrated circuit geometries in integrated circuits. With scaled-down device dimensions, shallow junction depths, thinner gate oxides, lightly doped drain (LDD) structures, and the use of salicide process technology, integrated circuits generally become more susceptible to ESD damage. This becomes more severe when the integrated circuit consists of multiple independently-powered circuit sections (e.g., sections of the integrated circuit having isolated power rails).

The Human Body Model (HBM) is a commonly used model for characterizing the susceptibility of an electronic device to damage from ESD. The model is a simulation of the discharge which might occur when a human touches an electronic device. The Machine Model (MM) is an alternative ESD model representing a discharge similar to the HBM event from a charged conductive object, such as a metallic tool or fixture. The Charged Device Model, in contrast, represents a transfer of charge from an ESD protection device. A CDM event can be more destructive than an HBM event for some devices. Although the duration of the discharge is very short (e.g., often less than one nanosecond) the peak current can reach several tens of amperes. Generally, the ESD robustness of integrated circuit devices should exceed 2 kV for HBM ESD events, 200V for MM events, and/or 500V for CDM events. It is often desirable to design integrated circuits that can satisfy these requirements with some margin of safety.

In advanced VLSI integrated circuit devices, power lines may be separated to avoid noise coupling and to reduce ground bouncing for high-performance circuit operation. However, it has been shown that integrated circuits with separated power pins and separated power lines may be more sensitive to ESD damage. For example, FIG. 1 shows a conventional ESD protection scheme in a mixed signal integrated circuit 100. Circuit 100 includes independently-powered circuit sections (e.g., input/output circuits) 110 and 140. Each circuit 110 and 140 has separate power lines. For example, circuit 110 includes first independent positive power rail (VDDIO_I) 111 and first independent negative power rail (VSSIO_I) 112. Similarly, circuit 140 has second independent positive power rail (VDDIO_II) 141 and second independent negative power rail (VSSIO_II) 142. Circuits 110 and 140 may receive their power from pads 113, 115, 143, and 145 (e.g., pins or ball bond for coupling to a power source that is external to the integrated circuit).

Each independently-powered circuit in this example has its own ESD protection devices in I/O buffers, RC shunts in power and ground pads, diodes and back-to-back diodes. The combination of ESD devices generally forms a complete route to shunt ESD current away from internal circuits during an ESD event. For example, in circuit 110 bond pads 113, 114, and 115 each represent a single I/O, power, or ground pad. For I/O pad 114, an output transistor (Mn_I) 116 and driver transistor (Mp_I) 117 act as ESD protection devices. Driver transistor 117 has its gate pulled high, drain coupled to I/O pad 114, and source and bulk both tied to the local power line 111. Output transistor 116 has its gate pulled low, drain coupled to I/O pad 114, and source and bulk both tied to local power line 112. Output transistor 116 thus forms a drain-bulk diode coupled between I/O pad 114 and negative power rail (VSSIO) 112, and driver transistor 117 forms a drain-bulk diode coupled between I/O pad 114 and positive power rail (VDDIO) 111. These two diodes also conduct current during ESD event. Some implementations may include additional ESD diodes 117 and 118. Output transistor 116 may commonly comprise a grounded gate NMOS (GGNMOS), also configured to be a breakdown device. The drain, bulk and source regions of output transistor 116 may form a bipolar junction transistor (BJT) device.

During an ESD event, the parasitic BJT may turn on and shunt the current to its source, in this case the negative power rail 112. Generally, a well-designed breakdown device will, during an ESD event, shunt the current sooner than a PFET transistor as long as the power lines are floating. This generally occurs because the gain of an n-type transistor is greater than a p-type transistor due to the lower diffusitivity of holes in NMOS. However, for simplicity, both GGNMOS 116 and ESD diodes 117 and 118 are shown in FIG. 1. I/O pad 144 of independently-powered circuit 140 has similar protection.

The independently-powered circuits also generally have ESD protection for each power and/or ground pad. For example, in independently-powered circuit 110, power pad 113 and ground pad 115 have RC-triggered shunt devices 119 and 120 across power lines 111 and 112. RC shunt devices 119 and 120 generally provide a low impedance path for ESD current to be shunted away from positive power rail (VDDIO) 111 to negative power rail (VSSIO) 112.

Referring now to FIG. 2, a detailed RC shunt device 120 is shown. During an ESD event, the RC circuitry generally pulls the intermediate node 123 low and in turn biases the gate of transistor 122. Transistor 122 is typically an NMOS device having total device width (W) of more than 1000 μm. When the gate of transistor 122 is biased at a voltage above a certain threshold, the transistor will turn on and create a short between power lines 111 and 112 to shunt the ESD current. Many factors must be considered when designing an RC-triggered shunt circuit. The combination of resistor 121 and capacitor 124 generally determines the period during which the RC shunt will be active during an ESD event. However, resistor 121 and capacitor 124 must also be selected such that, during normal operation (e.g., in the absence of an ESD event), the voltage at node 123 is high enough to keep inverter 125 tied low, so that transistor 122 remains turned off. Typical RC shunt delays are in the range of 1 to 5 micro-seconds (μs). The delay has much different magnitude from the rate of power ramping, which usually falls in the millisecond (ms) range. Accordingly, a circuit designer would not configure the RC shunt to have a delay near the millisecond range, to avoid a false triggering of the RC shunt device during a ramp of the power supply. Furthermore, in inverter 125 a PFET transistor 126 is generally much larger than the NFET transistor 127, in order to facilitate fast activation of the shunt device 120 when an ESD event occurs.

An ESD event may occur across any two pins in an IC device (e.g., whether they are input, output, power or ground pins). For example, an ESD event may occur between I/O pad 114 and I/O pad 144 of FIG. 1, with a positive charge at I/O pad 114 and a negative charge at I/O pad 144. A low impedance path must exist to shunt the ESD current away from the internal circuits (e.g., internal circuits 130 and 160) in order to avoid damage resulting from the ESD event. Generally, the ESD protection scheme shown in FIG. 1 employs power busses such as global positive power rail (VDD) 101 and independent positive power rails (VDDIO) 111 and 141, and ground busses such as global negative power rail (VSS) 102 and independent negative power rails (VSSIO) 112 and 142, to carry the ESD current. In this event, an ESD current enters the circuit at I/O pad 114 and flows through diode 117 to power line 111. The sudden change of voltage at power line 111 will trigger the RC shunts 119 and 120 to create a substantially instantaneous short between power line 111 and ground line 112. The ESD current then flows through this less resistive path created by the sudden short from power line 111 to ground line 112. The ESD current may then flow from independent ground line 112 to global ground line 102 through back-to-back diodes 103, then from the global ground line 112 to second independent ground line 142 in independently-powered circuit 141. The ESD current may then complete the circuit by flowing through diode 148 to I/O pad 144, where the ESD current exits the chip.

In order to protect the internal circuit from ESD damage, the voltage drops along the ESD current carrying path should be maintained below a breakdown voltage $V_{breakdown}$ of the gate oxide and silicon junctions of the devices in the path. The total voltage drop for the above-described ESD event between I/O pad 114 and I/O pad 144 is the sum of the threshold voltages for entering diode 118 and exiting diode 148 (typically 0.7V each), IR voltage drops across the RC shunt devices (typically 6V), threshold voltage for back-to-back diode 103 (typically 0.7V each) and the IR voltage drop across power supply and ground substrates when the ESD current flows through the parasitic resistance at the power busses.

Usually the global positive power rail (VDD) 101 and the global negative power rail (VSS) 102 busses are configured as a continuous ring around the IC. Therefore, the total protection of devices across global power lines is the sum of all the shunt devices connected to the VDD and VSS power ring. This raises the threshold for ESD damage to occur across VDD and VSS. However, as shown in FIG. 1, there are cases where the chip may be separated into independently-powered circuits (e.g., because some parts of the chip require "clean" power supplies, some of the supplies have low noise immunity, and some power supplies generate noise during normal operation, especially clock pins connected to an external power supply).

By separating power lines, noise coupling and other problems as described above can be reduced. However, separating the power lines may reduce protection from ESD events. Mixed signal integrated circuits having multiple independent power lines may be more susceptible to ESD damage, especially in sections of the integrated circuit where few power pads are used. As shown above, RC-triggered shunt devices (e.g., RC shunt device 120 of FIG. 2) are generally coupled to power pads (e.g., power pads 113 and 115). Thus, when there are relatively few power pads in a section, there is generally less capacity for shunting ESD current from supply to ground.

Referring now to FIG. 3, integrated circuit 300, having independently-powered sections 310 (Section I), 320 (Section II), and 330 (Section III), is shown. Independently-powered section 310 has multiple I/O pads 311, multiple power (VDDIO) pads 312, and multiple ground (VSSIO) pads 313. Thus, section 310 is generally adequately protected because the multiple power pads provide multiple RC shunt devices 314 and 315 in parallel, facilitating the shunting of an ESD current when an ESD event occurs at I/O pads 311.

Independently-powered section 320 has only one I/O pad 321 accompanied by one power pad 322 and one ground pad 323. Thus, in independently-powered section 320, there may be only two RC shunt devices 326 and 327 connecting power line 324 and ground line 325. Any ESD current that enter at I/O pad 321 would flow through diode 378 to power line 324, then trigger RC shunt devices 326 and 327 to shunt the ESD current to ground line 325. By having multiple RC shunts as in sections 310 and 330, the IC can surpass HBM 2 kV requirements, because multiple parallel shunts may activate at substantially the same time to shunt the ESD current. This reduces the IR voltage drops across the shunts by 30% to 50% compared to the 2 RC shunt devices 326 and 327 in section 320. Thus, section 320 is relatively susceptible to ESD damage because it has a relatively high total IR voltage drop (e.g., because it has fewer parallel RC shunt devices), so that the total voltage drop is more likely to exceed $V_{breakdown}$.

One solution to this problem is to add multiple power pads to a section to increase the section's protection from ESD events. However, as integrated circuit technology progresses with decreasingly small scales, such an approach may require 10 or more power and ground pads to protect one or two isolated I/O pads. Thus, this approach becomes increasingly impractical as it consumes relatively large areas of a semiconductor die, increasing the cost of manufacturing the integrated circuit devices.

Therefore, it may be beneficial or advantageous to protect integrated circuits having independently-powered circuit sections from electrostatic discharge events without adding redundant power and/or ground pads.

SUMMARY OF THE INVENTION

Embodiments of the present invention relate to circuitry, systems, and methods for protecting an integrated circuit having independently-powered circuit sections from electrostatic discharge events. The integrated circuit generally comprises an ESD control line, a first circuit having a first electrostatic discharge (ESD) device coupled to a first positive voltage rail, a first negative voltage rail, and the ESD control line, the first ESD device configured to activate an ESD control signal on the ESD control line when an electrostatic discharge occurs, and a second circuit having a second positive voltage rail, a second negative voltage rail, and a second ESD device, coupled to the second positive voltage rail, the second negative voltage rail, and the ESD control line, the second ESD device configured to shunt current between the second positive voltage rail and the second negative voltage rail when the ESD control signal is activated.

In a preferred embodiment, the integrated circuit includes an ESD tie cell coupled to the first positive voltage rail, the second positive voltage rail, and the ESD control line. The ESD tie cell is configured to close a circuit (e.g., to close a switch and/or create a short) between the first positive voltage rail and the second positive voltage rail when the ESD control signal is activated. The ESD tie cell may comprise a p-type transistor, and the gate of the p-type transistor may be coupled to the ESD control line. Alternatively, the ESD tie cell may comprises a silicon controlled rectifier (SCR), in particular a PMOS-triggered SCR (PSCR) which may have a gate coupled to the ESD control line.

In another device the ESD protection devices may include RC shunts. The RC shunts may include a shunt resistor having a first node coupled to the first positive voltage rail, a shunt capacitor having a first node coupled to the ESD control line and a second node coupled to the first negative voltage rail, an inverter having an input coupled to the ESD control line, and a shunt transistor having a gate coupled to an output of the input, a first source/drain coupled to the first positive voltage rail, and a second source/drain coupled to the first negative voltage rail. In a further embodiment, the shunt transistor comprises an NMOS transistor having a total device width of at least 1000 µm. In a preferred embodiment, the shunt resistor and the shunt capacitor have an RC delay of between 1 and 5 µs.

In an exemplary embodiment, the second circuit comprises a plurality of power pads (e.g., exposed terminals of the integrated circuit such as bond pads, configured to receive an external power supply) coupled to the second positive voltage rail, a plurality of ground pads (e.g., configured to receive an external ground) coupled to the second negative voltage rail, and at least one input/output (I/O) pad. The first circuit may include as few as one power terminal coupled to the first positive voltage rail, one ground terminal coupled to the first negative voltage rail, and an I/O terminal. The terminals may be exposed terminals on the surface of the integrated circuit device for communication with external signals and/or power supplies, such as bond pads.

The method relates to protecting an integrated circuit from an electrostatic discharge event, wherein the integrated circuit comprises a first circuit having a first positive voltage rail and a first negative voltage rail, and a second circuit having a second positive voltage rail and a second negative voltage rail. The method includes the steps of producing an ESD control signal on an ESD control line when an electrostatic discharge occurs, closing a switch between the first positive voltage rail and the second positive voltage rail in response to the ESD control signal, shunting an ESD current from the first positive voltage rail to the first negative voltage rail in response to the ESD control signal, and shunting the ESD current from the second positive voltage rail to the second negative voltage rail in response to the ESD control signal.

In one embodiment, the switch may comprise a p-type transistor, and the gate of the p-type transistor may be coupled to the ESD control line. Alternatively, the switch may comprise a silicon controlled rectifier (SCR), in particular a PMOS-triggered SCR (PSCR) which may have a gate coupled to the ESD control line.

The step of producing the ESD control signal may comprise detecting the ESD event across an RC shunt. The RC shunt may comprise a shunt resistor coupled to the first positive voltage rail and to an intermediate node, a shunt capacitor having coupled to the first negative voltage rail and to the intermediate node, an inverter having an input coupled to the intermediate node, and a shunt transistor having a gate coupled to an output of the input, a first source/drain coupled to the first positive voltage rail, and a second source/drain coupled to the first negative voltage rail. In a further embodiment, producing the ESD control signal further comprises applying the intermediate node of the RC shunt to the ESD control line.

The systems generally comprise those that include a circuit embodying one or more of the inventive concepts disclosed herein.

The present invention advantageously protects integrated circuits having independently-powered circuit sections from electrostatic discharge events without adding redundant power and/or ground pads by sharing ESD shunting capacity between circuit sections during an ESD event.

These and other advantages of the present invention will become readily apparent from the detailed description of preferred embodiments below.

BRIEF DESCRIPTION OF THE DRAWINGS

FIG. 1 is a diagram showing a conventional integrated circuit having ESD protection.

FIG. 2 is a diagram showing a conventional RC shunt device.

FIG. 3 is a diagram showing a conventional integrated circuit having insufficient ESD protection.

FIG. 8A is a diagram of an exemplary hard disk drive.

FIG. 8B is a diagram of an exemplary digital versatile disc (DVD) player.

DETAILED DESCRIPTION OF THE PREFERRED EMBODIMENTS

Figure 4A:
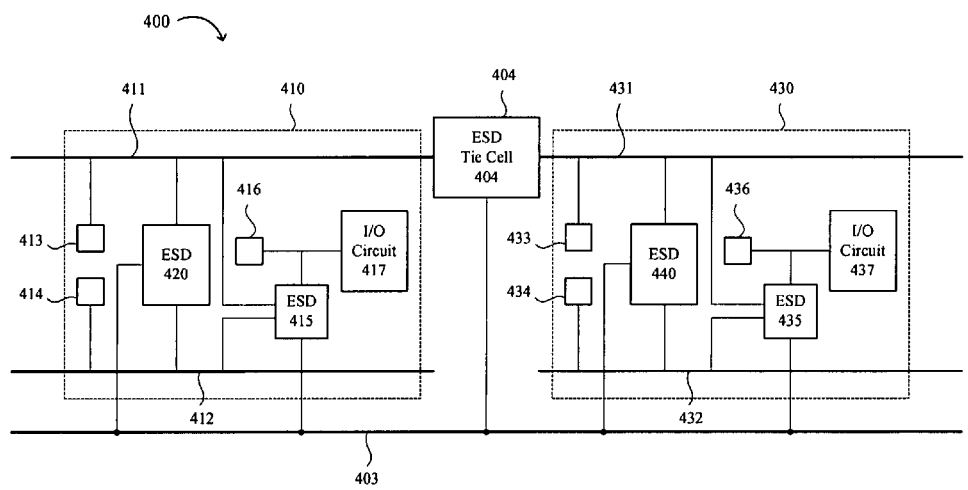
FIG. 4A is a diagram showing an integrated circuit having ESD protection according to the present invention.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications, and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on data bits, data streams, or waveforms within a computer, processor, controller, and/or memory. These descriptions and representations are generally used by those skilled in the data processing arts to effectively convey the substance of their work to others skilled in the art. A process, procedure, logic block, function, operation, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer, data processing system, or logic circuit. It has proven convenient at times, principally for reasons of common usage, to refer to these signals as bits, waves, waveforms, streams, values, elements, symbols, characters, terms, numbers, or the like.

It should be borne in mind, however, that all of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," "manipulating," "transforming," "displaying" or the like, refer to the action and processes of a computer, data processing system, logic circuit or similar processing device (e.g., an electrical, optical, or quantum computing or processing device), that manipulates and transforms data represented as physical (e.g., electronic) quantities. The terms refer to actions, operations and/or processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture.

Furthermore, for the sake of convenience and simplicity, the terms "clock," "time," "rate," "period" and "frequency" are generally used interchangeably herein, but are generally given their art-recognized meanings. Also, for convenience and simplicity, the terms "data," "data stream," "waveform" and "information" may be used interchangeably, as may the terms "connected to," "coupled with," "coupled to," and "in communication with" (which terms also refer to direct and/or indirect relationships between the connected, coupled and/or communication elements unless the context of the term's use unambiguously indicates otherwise), but these terms are also generally given their art-recognized meanings.

The invention, in its various aspects, will be explained in greater detail below with regard to exemplary embodiments.

An Exemplary Circuit

Referring now to FIG. 4A, an exemplary integrated circuit according to the present invention is shown. The integrated circuit 400 has two independently-powered circuit sections 410 and 430, and an ESD control line 403 coupled to both circuit sections. The first circuit section has one or more ESD devices (e.g., ESD devices 414 and 420) coupled to a first positive voltage rail 411, a first negative voltage rail 412, and the ESD control line 403. At least one of the ESD devices (e.g., ESD device 420) is configured to activate an ESD control signal on the ESD control line when an electrostatic discharge occurs. The second circuit section has one or more ESD devices (e.g., ESD devices 435 and 440) coupled to a second positive voltage rail 431 (e.g., a power rail that is independent of and/or isolated from first positive voltage rail 411), a second negative voltage rail 432, and the ESD control line. At least one of the ESD devices (e.g., ESD device 440) is configured to shunt current between the second positive voltage rail and the second negative voltage rail when the ESD control signal is activated.

Independently-powered circuit sections 410 and 430 may, for example, include one or more power pads 413, 414, 433, and 434 (e.g., external terminals comprising bond pads, ball bonds, pins, or other interconnection devices for coupling to external power sources). The circuit sections may also include I/O pads (e.g., pads 416 and 436 for coupling to an external I/O signal) coupled to internal I/O circuits (e.g., I/O circuits 417 and 437 for processing an external I/O signal from pads 416 and 436, respectively). The internal I/O circuits generally must be protected from ESD. It will be recognized that the arrangements as shown in FIG. 4A are only for illustration, and that the present invention may be applied to provide ESD protection in a wide variety of pad and circuit arrangements in integrated circuit devices.

In a preferred embodiment, the integrated circuit includes an ESD tie cell 404 coupled to the first positive voltage rail 411, the second positive voltage rail 432, and the ESD control line 403. The ESD tie cell is configured to close a circuit (e.g., to close a switch and/or create a short) between the first positive voltage rail 411 and the second positive voltage rail 432 when the ESD control signal is activated. The ESD tie cell 404 may comprise a p-type transistor, and the gate of the p-type transistor may be coupled to the ESD control line. Alternatively, the ESD tie cell may comprises a silicon controlled rectifier (SCR), in particular a PMOS-triggered SCR (PSCR) which may have a gate coupled to the ESD control line, as is described in more detail below.

Figure 4B:
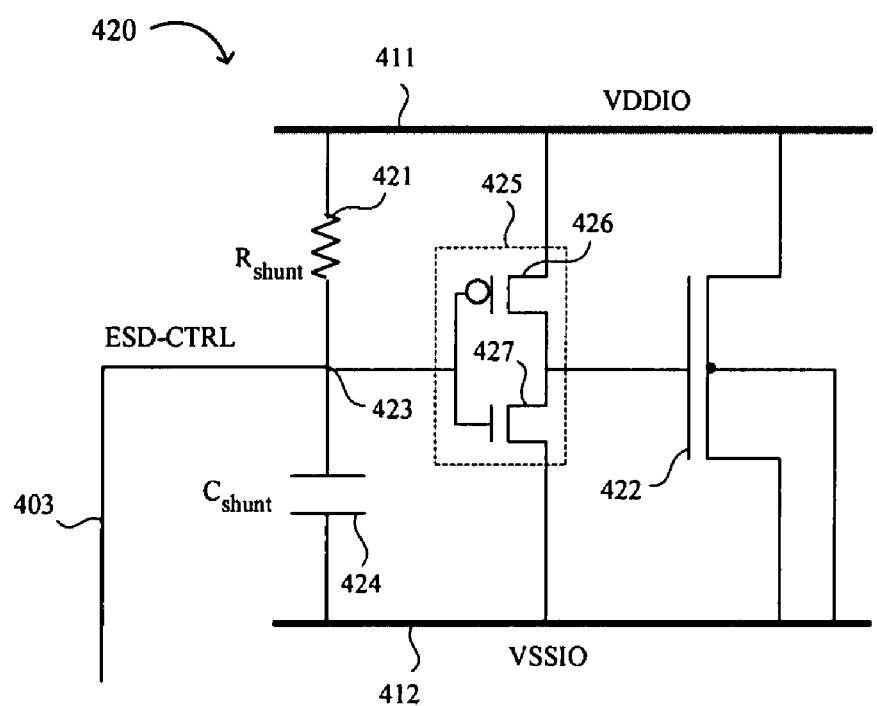
FIG. 4B is a diagram showing an RC shunt device according to the present invention.

The ESD devices 415 and 435 may include grounded-gate NFET transistors, which may act as breakdown devices during an ESD event. The ESD devices 420 and 440 may include RC shunt devices. For example, referring now to FIG. 4B, a detailed RC shunt device 420 according to the present invention is shown. Intermediate node 423 is coupled to the ESD control line (e.g., ESD control line 403 of integrated circuit 400). Shunt resistor 421 has a first node coupled to the positive voltage rail 411 and a second node coupled to the intermediate node 423. Shunt capacitor 424 has a first node coupled to the intermediate node 423 and a second node coupled to the negative voltage rail 412. Inverter 425 has an input coupled to the intermediate node 423. Shunt transistor 422 has a gate coupled to an output of the input, a first source/drain coupled to the positive voltage rail 411, and a second source/drain coupled to the negative voltage rail 412. Shunt transistor 422 may comprise an NMOS transistor having a total device width of at least 1000 μm.

Many factors must be considered when designing an RC-triggered shunt circuit. The combination of resistor 421 and capacitor 424 generally determines the period during which the RC shunt will be active during an ESD event. However, resistor 421 and capacitor 424 must also be selected such that, during normal operation (e.g., in the absence of an ESD event), the voltage at node 423 is high enough to keep inverter 425 tied low, so that transistor 422 remains turned off. Typical RC shunt delays are in the range of 1 to 5 micro-seconds (μs). The delay has much different magnitude from the rate of power ramping, which usually falls in the millisecond (ms) range. Accordingly, a circuit designer should not configure the RC shunt to have a delay near the millisecond range, to avoid a false triggering of the RC shunt device during a ramp of the power supply. Furthermore, in inverter 425 a PFET transistor 426 is generally much larger than a NFET transistor 427, in order to facilitate fast activation of the shunt device 420 when an ESD event occurs.

During an ESD event, the RC circuitry generally pulls the intermediate node 423 low and in turn biases the gate of transistor 422. Thus, when an ESD event occurs the ESD control line 403 will also be pulled low, resulting in an ESD signal that can trigger other devices to begin shunting the ESD current. When the gate of transistor 422 is biased at a voltage above a certain threshold, the transistor will turn on and create a short between power rails 411 and 412 to shunt the ESD current.

Figure 5A:
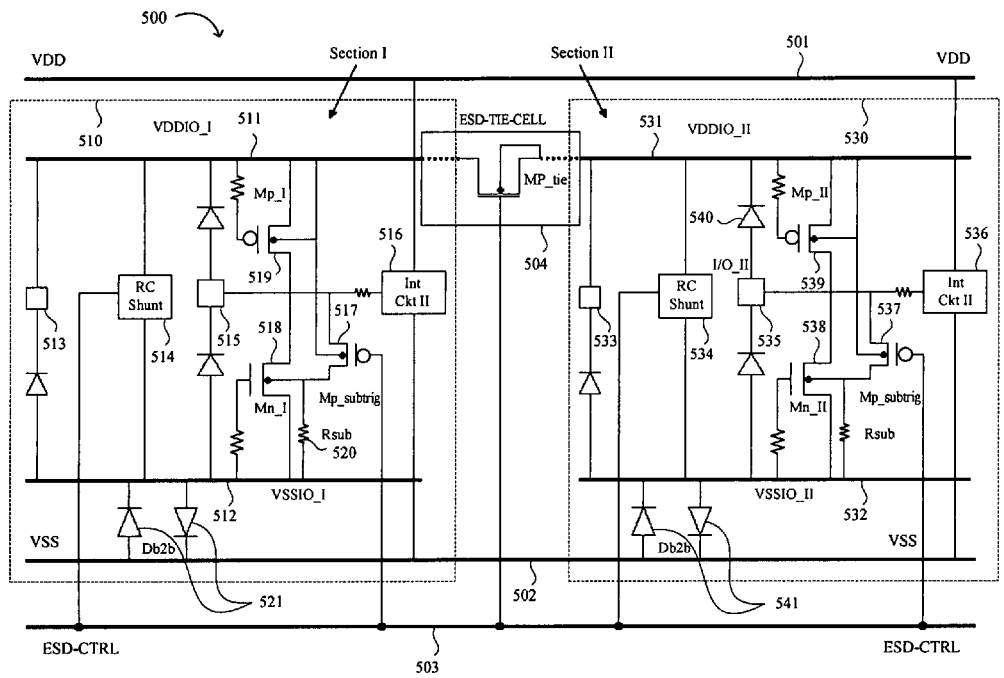
FIG. 5A is a detailed diagram showing an integrated circuit having ESD protection according to the present invention.

Referring now to FIG. 5A, an integrated circuit 500 includes independently-powered circuit sections 510 and 530. Section 510 includes first positive voltage rail (e.g., a power line, conventionally labeled VDDIO_I) 511 and first negative voltage rail (e.g., a ground line, conventionally labeled VSSIO_I) 512. Section 530 includes second positive voltage rail (VDDIO_II) 531 and second negative voltage rail (VSSIO_II) 532. Section 510 may comprise a common I/O section comprising multiple I/O pads 515 and multiple power/ground pads 513. Therefore section 510 may have adequate protection from ESD events provided by multiple RC shunt circuits 514. Section 530 may be an isolated power line with only one (or relatively few) I/O pad 535, one set of power/ground pads 533. Thus, section 530 (without the benefit of the present invention) may not have sufficient RC shunt devices 534 to protect the internal circuit 536.

The present invention, however, utilizes the RC shunt devices across each of the power and ground pads of the integrated circuit to provide additional protection to the isolated section 530. In each of the RC shunt devices 514 and 534, the intermediate nodes of the devices (e.g., intermediate node 123 of exemplary RC shunt device 120 of FIG. 2) are connected together to form an ESD control bus (ESD-CTRL) 503. The ESD control bus may be configured in a ring around the integrated circuit chip. This ESD control bus may be coupled to one or more devices ESD tie cells 504 configured to tie together the power lines of independently-powered circuit sections (e.g., configured to tie power line 511 of circuit section 510 to power line 531 of circuit section 530).

ESD control bus 503 may also be coupled to the ESD protection devices for I/O pads. For example, to protect I/O pad 515, the ESD control bus may be coupled to the gate of transistor 517 in circuit section 510. Transistor 517 may comprise a p-type transistor, with its drain coupled to the bulk of n-type transistor 518, source coupled to I/O pad 515, and bulk coupled to power line 511. Transistor 517 generally drives the bulk electrode of transistor 518, where the substrate resistor 520 couples the bulk of transistor 518 to the ground line 512 during normal operation (e.g., in the absence of an ESD event). Similarly, transistor 537 of circuit section 530 may be coupled to ESD control bus 503 to protect I/O pad 535.

During normal operation, the positive voltage rail 531 of second independently-powered section 530 is generally biased at a fixed potential, such as 1.8V, 2.5V or 3.3V. Thus, through the conductivity of the RC shunt resistor (e.g., resistor 121 of exemplary RC shunt 120 of FIG. 2), the gate of transistor 537 is also biased at the same potential as its power rail 531 to turn off transistor 537. The bulk (or substrate) of n-type transistor 538 is coupled to ground rail 532 and the gate of n-type transistor 538 is coupled to ground through a resistor to turn off transistor 538, so that an I/O signal can be communicated from I/O pad 535 to internal circuit 536.

Figure 6:
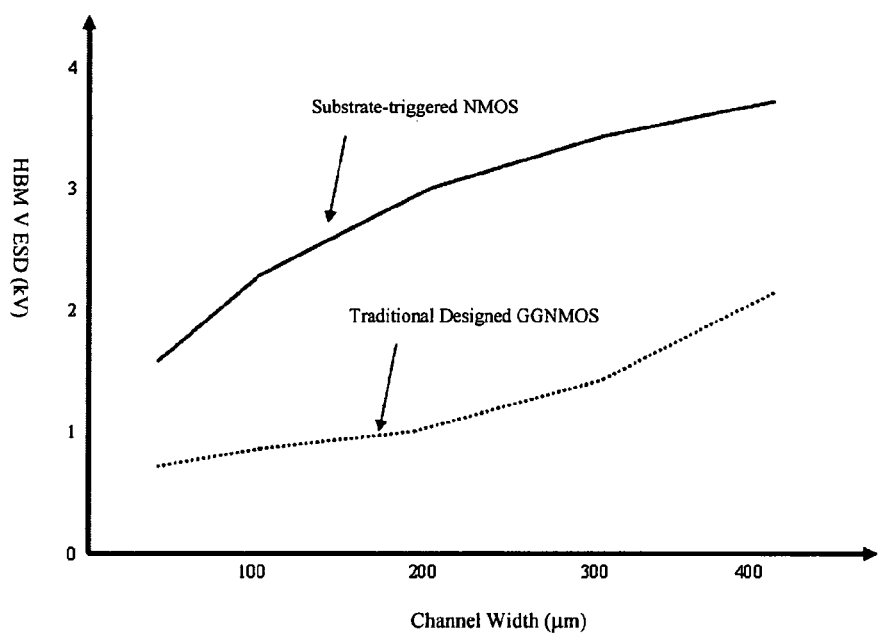
FIG. 6 is a graph comparing the ESD protection characteristics of substrate-triggered NMOS and grounded-gate NMOS devices.

When an ESD event occurs with a positive charge at I/O pad 535, the RC shunt 534 will temporarily pull the gate voltage of transistor 537 at a low potential (e.g., to ground, or approximately zero volts). In this condition, transistor 537 has a voltage across its source and gate that is greater than its threshold voltage. Therefore, transistor 537 will turn on to conduct a trigger current into the bulk (or substrate) of transistor 538. This will trigger the parasitic BJT to turn on and shunt the ESD current to the local ground rail 532. This is a substrate-triggered protection technique which utilizes the short period of current injection into the substrate to enhance the performance of the breakdown devices. Thus, in a preferred embodiment, ESD protection transistors 537 and/or 538 comprise substrate-triggered grounded gate NMOS (GGNMOS) transistors. As shown in FIG. 6, substrate-triggered GGNMOS ESD protection devices can provide significantly better ESD protection for a given channel width as compared to conventional GGNMOS devices.

In this example, circuit section 530 has only two RC shunt devices 534 (e.g., one RC shunt device for a power pad 533, and one device for a ground pad 533). As described above, this arrangement along may not be sufficient to dissipate an ESD event. Therefore, without using additional power and ground pads to add more RC shunt devices to circuit section 530, ESD tie cell 504 may be used to temporarily provide more shunting capacity. When an ESD event occurs, an active ESD signal is applied to ESD control bus 503 (e.g., ESD control bus 503 is pulled low), which causes the ESD tie cell 503 couple independent power rails 511 and 531 for the duration of the ESD event. By tying the two power lines together, the shunting capacity of both circuit sections 510 and 530 can be combined to shunt ESD current to ground rails 512 and 532. Eventually, the ESD current will flow to the grounded pin, in this case global current rail (VSS) 502), through back-to-back diodes 521 and/or 541.

Figure 5B:
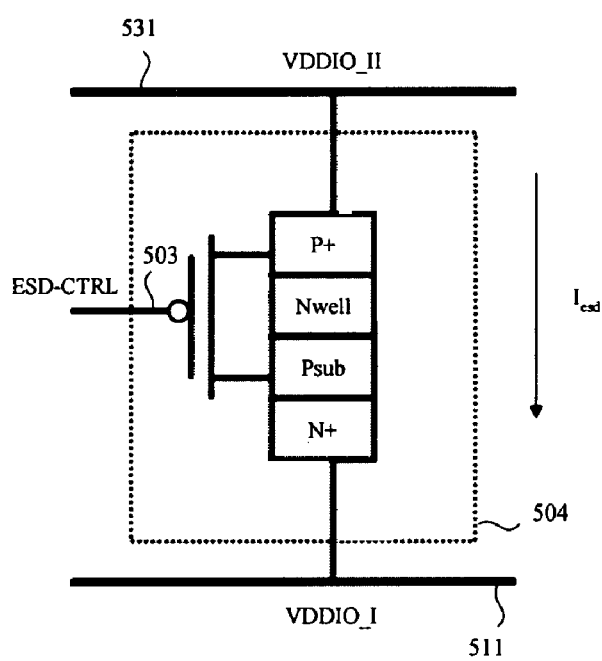
FIG. 5B is diagram showing a PMOS-triggered silicon controlled rectifier (PSCR) used as an ESD tie cell according to the present invention

ESD tie cell 504 may alternatively comprise a silicon controlled rectifier (SCR). Referring now to FIG. 5B, an ESD tie cell 504 is shown as a PMOS-triggered SCR (PSCR). The PSCR provides a current path between the positive voltage rails 511 and 531 of circuit sections 510 and 530, respectively. The gate of PSCR is coupled to ESD control bus 503. During an ESD event, the ESD control bus is driven low, and the voltage differential between positive voltage rail 531 and the ESD control bus 503 is greater than the threshold voltage of the PSCR. Thus, PSCR will be turned on to provide a low impedance path between the power rails of the independently-powered circuit sections.

Referring back to FIG. 5A, during normal operation, the ESD control line does not carry an active ESD signal (e.g., ESD control line 503 may be held high), so that the ESD tie cell 504 is not active, and power rails 511 and 531 remain independent. Thus, in an integrated circuit according to the present invention, the shunt devices of one independently-powered circuit section (e.g., section 510) can be utilized to supplement the ESD protection devices of a second independently-powered circuit section (e.g., section 530). It will be readily apparent to a person skilled in the art that the same technique may be used to supplement the ESD protection devices of an independently-powered circuit section with ESD protection devices from one or more other circuit sections using a single ESD control bus and a plurality of inter-linked ESD tie cells. This provides multiple parallel paths for ESD current to flow through and significantly reduce the IR voltage drop across parallel shunt devices. Using the present invention, the total voltage drop around the ESD current carrying path can be reduced by approximately 30% to 50%. Thus, independently powered circuit sections with isolated power lines can have much greater ESD protection without adding redundant power and/or ground pads with associated RC shunt devices.

In certain implementations of the present invention, ESD current flows through the ESD tie cells when an ESD event occurs. Therefore, the ESD tie cell is preferably treated and/or designed as an ESD device, and ESD design guidelines should be applied. For example, using 0.13 µm design rules, ESD tie cells may have a minimum width of 20 µm and a minimum length of 0.4 µm, appropriate guard-ring protection, good contact and via connection(s), adequate metal routing, well configured drain contact to polysilicon spacing, etc.

An Exemplary Method

Figure 7:
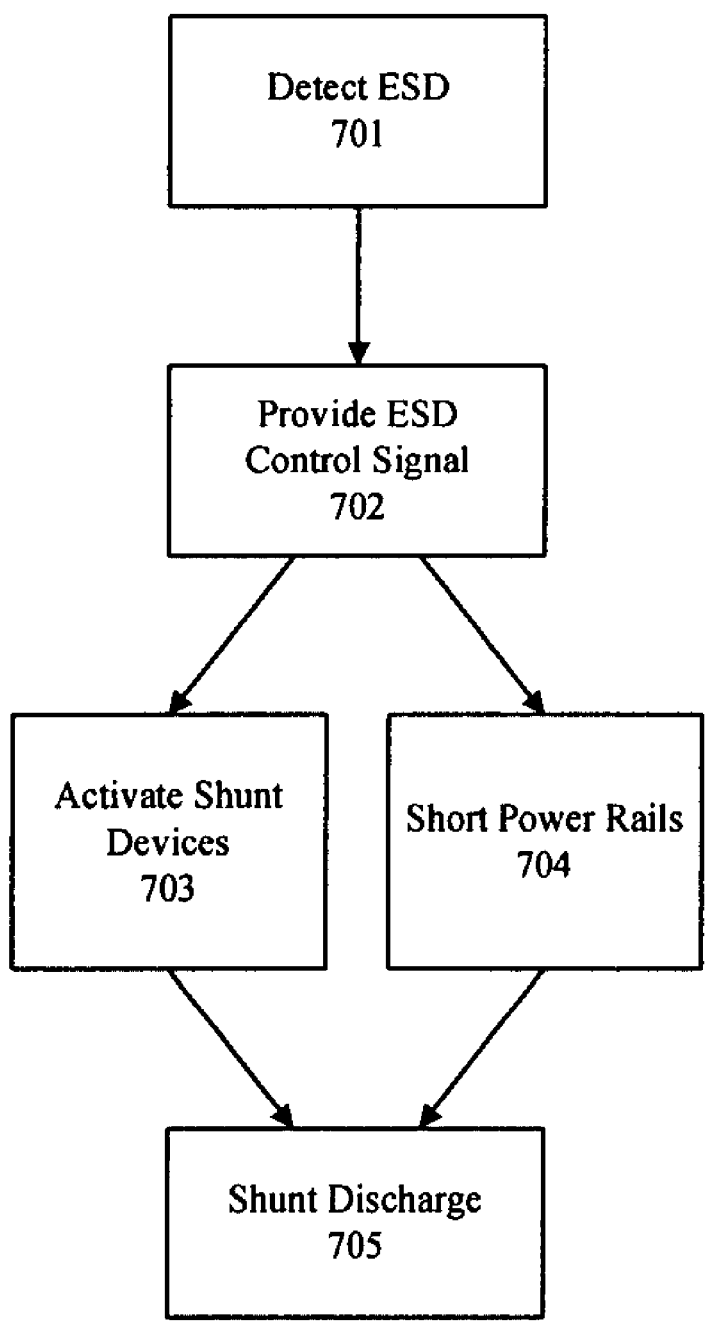
FIG. 7 is a diagram showing a method according to the present invention for protecting an integrated circuit from an ESD event.

Referring now to FIG. 7, an exemplary method of protecting an integrated circuit from an electrostatic discharge event is shown. The integrated circuit generally includes a first circuit having a first positive voltage rail and a first negative voltage rail (e.g., independently-powered circuit section 430 of FIG. 4A), and a second circuit having a second positive voltage rail and a second negative voltage rail (e.g., independently-powered circuit section 410 of FIG. 4A).

At step 701 of FIG. 7, an ESD event is detected. For example, during an ESD event, the RC circuitry in an RC shunt (e.g., RC shunt 420 of FIGS. 4A and 4B) generally pulls the intermediate node low (e.g., at the node 423 between the resistor 421 and capacitor 424), thus detecting the ESD event. At step 702 of FIG. 7, the method includes the step of producing an ESD control signal on an ESD control line when the electrostatic discharge occurs. For example, when the intermediate node of an RC shunt device is coupled to the ESD control line (e.g., ESD control line 403 of FIG. 4A), and the intermediate node is pulled low by the ESD event, a signal is produced on the ESD control line.

In response to the ESD control signal (e.g., a signal on the ESD control line indicating that an ESD event has occurred), the method includes step 704 of shorting the power rails of the independently-powered circuit sections (e.g., by activating ESD tie cell 404 of FIG. 4A). Simultaneously, at step 703 additional shunt devices are activated. Referring now to FIG. 5A, for example, if ESD control line 403 is pulled low to indicate an ESD event, then transistor 517 in independently-powered circuit section 510 has a voltage across its source and gate that is greater than its threshold voltage. Therefore, transistor 517 will turn on to conduct a trigger current into the bulk (or substrate) of transistor 518. This will trigger the parasitic BJT to turn on and shunt the ESD current to the local ground rail 512. Thus, at step 705 the ESD current is shunted through ESD protection devices in both of the independently-powered circuit sections.

Exemplary Systems

The integrated circuits incorporating the ESD protection described herein can be implemented in various exemplary systems, as described below. Referring now to FIG. 8A, for example, the present invention can be implemented as part of a hard disk drive 900 (or control unit therefor). The present invention may further contain signal processing and/or control circuits, generally identified in FIG. 8A at 402. In some implementations, the signal processing and/or control circuit 902 and/or other circuits in the HDD 900 may process data, perform coding and/or encryption, perform calculations, and/or format data that is output to and/or received from a magnetic storage medium 906.

The HDD 900 may communicate with a host (not shown) such as a computer, mobile computing devices such as personal digital assistants, cellular phones, media or MP3 players and the like, and/or other devices via one or more wired or wireless communication links 908. The HDD 900 may be connected to memory 909 such as random access memory (RAM), low latency nonvolatile memory such as flash memory, read only memory (ROM) and/or other suitable electronic data storage.

Referring now to FIG. 8B, the present invention can be implemented in an IC for a digital versatile disc (DVD) drive 910. ICs according to the present invention may further include either or both signal processing and/or control circuits, which are generally identified in FIG. 8B at 912. The signal processing and/or control circuit 912 and/or other circuits (not shown) in the DVD may process data, perform coding and/or encryption, perform calculations, and/or format data that is read from and/or data written to an optical storage medium 916. In some implementations, the signal processing and/or control circuit 912 and/or other circuits (not shown) in the DVD 910 can also perform other functions such as encoding and/or decoding and/or any other signal processing functions associated with a DVD drive.

The DVD drive 910 may communicate with an output device (not shown) such as a computer, television or other device via one or more wired or wireless communication links 917. The DVD 910 may communicate with a mass data storage 918 that stores data in a nonvolatile manner. The mass data storage 918 may include a hard disk drive (HDD), such as the HDD 900 shown in FIG. 8A. The HDD may also be or comprise a mini HDD that includes one or more platters having a diameter that is smaller than approximately 1.8". The DVD may be connected to a memory 919 such as RAM, ROM, low latency nonvolatile memory such as flash memory and/or other suitable electronic data storage.

Figure 8C:
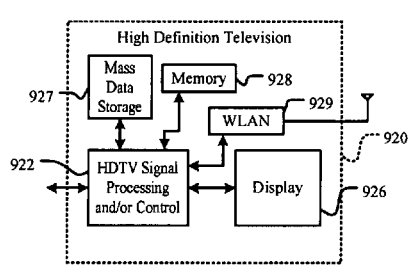
FIG. 8C is a diagram of an exemplary high definition television (HDTV).

Referring now to FIG. 8C, the present invention can also be implemented in an IC for a high definition television (HDTV) 920. The IC may include either or both signal processing and/or control circuits, which are generally identified in FIG. 8E at 922, a WLAN interface and/or mass data storage system of the HDTV 420. The HDTV 420 receives HDTV input signals in either a wired or wireless format and generates HDTV output signals for a display 926. In some implementations, signal processing circuit and/or control circuit 922 and/or other circuits (not shown) of the HDTV may process data, perform coding and/or encryption, perform calculations, format data and/or perform any other type of HDTV processing that may be required.

The HDTV 920 may communicate with a mass data storage 927 that stores data in a nonvolatile manner, such as optical and/or magnetic storage devices. At least one such optical and/or magnetic storage device may comprise the HDD 900 and/or DVD 910 described above and shown in FIGS. 8A-8B, respectively. The HDD may be or comprise a mini HDD that includes one or more platters having a diameter that is smaller than approximately 1.8". The HDTV 920 may be connected to a memory 928 such as RAM, ROM, low latency nonvolatile memory such as flash memory and/or other suitable electronic data storage. The HDTV 920 also may support connections with a WLAN via a WLAN network interface 929.

Figure 8D:
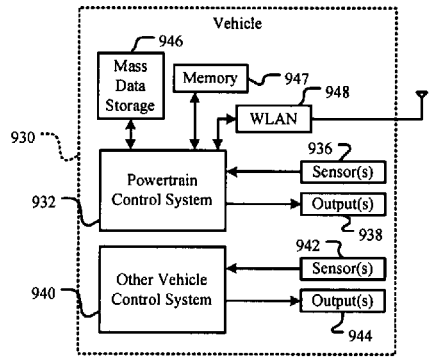
FIG. 8D is a diagram of an exemplary vehicle control system.

Referring now to FIG. 8D, the present invention can also be implemented in an IC for a control system 930 of a vehicle, a WLAN interface and/or mass data storage system of the vehicle control system. In some implementations, the present invention is implemented in a powertrain control system 932 that receives inputs from one or more sensors 936 such as temperature sensors, pressure sensors, rotational sensors, airflow sensors and/or any other suitable sensors and/or that generates one or more one or more output control signals such as engine operating parameters, transmission operating parameters, and/or other control signals to output devices 938.

The present invention may also be implemented in other control systems 940 of the vehicle 930. The control system 940 may likewise receive signals from input sensors 942 and/or output control signals to one or more output devices 944. In some implementations, the control system 940 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 932 may communicate with mass data storage 946 that stores data in a nonvolatile manner. The mass data storage 946 may include optical and/or magnetic storage devices (for example, hard disk drives [HDDs] and/or DVDs. At least one HDD may have the configuration shown in FIG. 8A and/or at least one DVD may have the configuration shown in FIG. 8B. The HDD may be or comprise a mini HDD that includes one or more platters having a diameter that is smaller than approximately 1.8". The powertrain control system 932 may be connected to memory 947 such as RAM, ROM, low latency nonvolatile memory such as flash memory and/or other suitable electronic data storage. The powertrain control system 932 also may support connections with a WLAN via a WLAN network interface 948. The control system 940 may also include mass data storage, memory and/or a WLAN interface (all not shown).

Figure 8E:
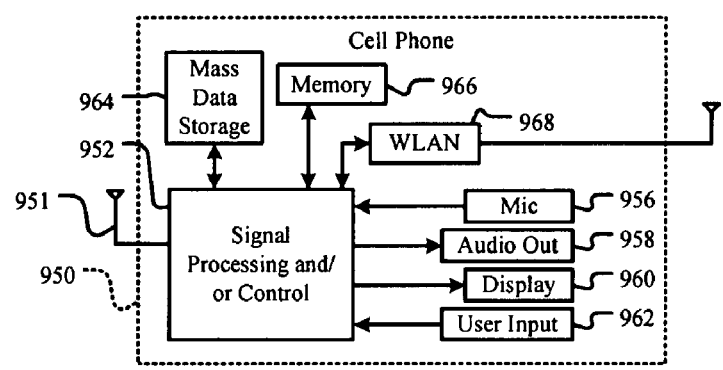
FIG. 8E is a diagram of an exemplary cellular or mobile phone.

Referring now to FIG. 8E, the present invention can be implemented in a cellular phone 950 that may include a cellular antenna 951. The present invention may include either or both signal processing and/or control circuits, which are generally identified in FIG. 8E at 952, a WLAN interface and/or mass data storage of the cellular phone 950. In some implementations, the cellular phone 950 includes a microphone 956, an audio output 958 such as a speaker and/or audio output jack, a display 960 and/or an input device 962 such as a keypad, pointing device, voice actuation and/or other input device. The signal processing and/or control circuits 952 and/or other circuits (not shown) in the cellular phone 950 may process data, perform coding and/or encryption, perform calculations, format data and/or perform other cellular phone functions.

The cellular phone 950 may communicate with mass data storage 964 that stores data in a nonvolatile manner, such as optical and/or magnetic storage devices (for example, hard disk drives [HDDs] and/or DVDs). At least one HDD may have the configuration shown in FIG. 8A and/or at least one DVD may have the configuration shown in FIG. 8B. The HDD may be a mini HDD that includes one or more platters having a diameter that is smaller than approximately 1.8". The cellular phone 950 may include or be connected to memory 966 such as RAM, ROM, low latency nonvolatile memory such as flash memory and/or other suitable electronic data storage. The cellular phone 950 also may support connections with a WLAN via a WLAN network interface 968.

Figure 8F:
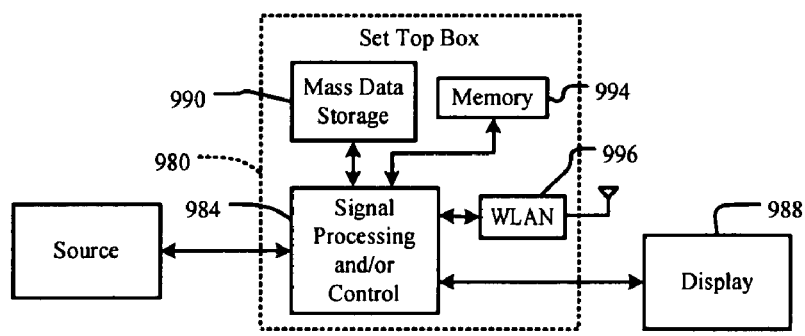
FIG. 8F is a diagram of an exemplary television set top box.

Referring now to FIG. 8F, the present invention can be implemented in an IC for a set top box 980. The present invention may include either or both signal processing and/or control circuits, which are generally identified in FIG. 8F at 984, a WLAN interface 996 and/or mass data storage 990 of the set top box 980. The set top box 980 receives signals from a source 986 (such as a broadband source) and outputs standard and/or high definition audio/video signals suitable for a display 988 (such as a television and/or monitor and/or other video and/or audio output devices). The signal processing and/or control circuits 984 and/or other circuits (not shown) of the set top box 980 may process data, perform coding and/or encryption, perform calculations, format data and/or perform any other set top box function.

The set top box 980 may communicate with mass data storage 990 that stores data in a nonvolatile manner. The mass data storage 990 may include optical and/or magnetic storage devices (for example, hard disk drives [HDDs] and/or DVDs). At least one HDD may have the configuration shown in FIG. 8A and/or at least one DVD may have the configuration shown in FIG. 8B. The HDD may be a mini HDD that includes one or more platters having a diameter that is smaller than approximately 1.8". The set top box 980 may be connected to memory 994 such as RAM, ROM, low latency nonvolatile memory such as flash memory and/or other suitable electronic data storage. The set top box 980 also may support connections with a WLAN via a WLAN network interface 996.

Figure 8G:
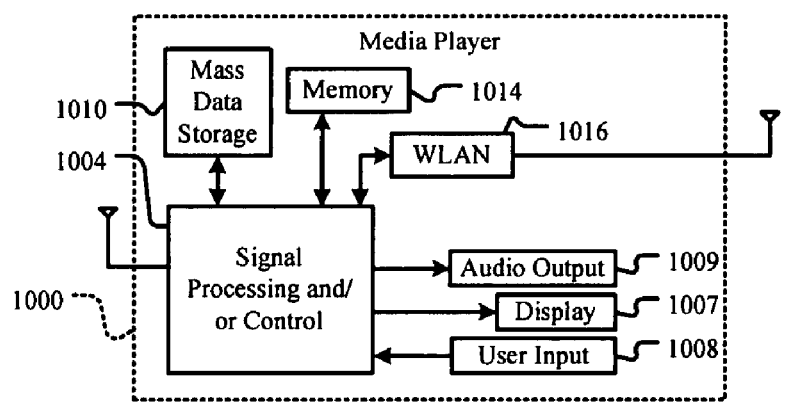
FIG. 8G is a diagram of an exemplary portable media player.

Referring now to FIG. 8G, the present invention can be implemented in an IC for a media player 1000. The present invention may implement either or both signal processing and/or control circuits, which are generally identified in FIG. 8G at 1004, a WLAN interface 1016 and/or mass data storage 1010 of the media player 1000. In some implementations, the media player 1000 includes a display 1007 and/or a user input 1008 such as a keypad, touchpad and the like. In some implementations, the media player 1000 may employ a graphical user interface (GUI) that typically employs menus, drop down menus, icons and/or a point-and-click interface via the display 1007 and/or user input 1008. The media player 1000 further includes an audio output 1009 such as a speaker and/or audio output jack. The signal processing and/or control circuits 1004 and/or other circuits (not shown) of the media player 1000 may process data, perform coding and/or encryption, perform calculations, format data and/or perform any other media player function.

The media player 1000 may communicate with mass data storage 1010 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices (for example, hard disk drives [HDDs] and/or DVDs). At least one HDD may have the configuration shown in FIG. 8A and/or at least one DVD may have the configuration shown in FIG. 8B. The HDD may be a mini HDD that includes one or more platters having a diameter that is smaller than approximately 1.8". The media player 1000 may be connected to memory 1014 such as RAM, ROM, low latency nonvolatile memory such as flash memory and/or other suitable electronic data storage. The media player 1000 also may support connections with a WLAN via a WLAN network interface 1016. Still other implementations in addition to those described above are contemplated.

CONCLUSION/SUMMARY

Thus, the present invention provides a circuit, a method, and systems, for protecting integrated circuits having independently-powered circuit sections from electrostatic discharge events without adding redundant power and/or ground pads by sharing ESD shunting capacity between circuit sections during an ESD event.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. An integrated circuit, comprising:
   an electrostatic discharge (ESD) control line;
   a first circuit having a first ESD device and a second ESD device, each of said first and second ESD devices being coupled to (i) a first positive voltage rail, (ii) a first negative voltage rail, and (iii) said ESD control line, said first ESD device configured to activate an ESD control signal on said ESD control line when an electrostatic discharge occurs and to shunt current between said first positive voltage rail and said first negative voltage rail when said ESD control signal is activated, and said second ESD device configured to shunt current from a first I/O pad to said first negative voltage rail when said ESD control signal is activated, said first I/O pad and said second ESD device further being coupled to a first input/output (I/O) circuit;
   a second circuit having a third ESD device and a fourth ESD device, each of said third and fourth ESD devices being coupled to (i) a second positive voltage rail, (ii) a second negative voltage rail, and (iii) said ESD control line, said third ESD device configured to activate an ESD control signal on said ESD control line when an electrostatic discharge occurs and to shunt current between said second positive voltage rail and said second negative voltage rail when said ESD control signal is activated, and said fourth ESD device configured to shunt current from a second I/O pad to said second negative voltage rail when said ESD control signal is activated, said second I/O pad and said fourth ESD device further being coupled to a second I/O circuit; and
   an ESD tie cell coupled to (i) said first positive voltage rail, (ii) said second positive voltage rail, and (iii) said ESD control line, said ESD tie cell configured to close a circuit between said first positive voltage rail and said second positive voltage rail when said ESD control signal is activated.

2. The integrated circuit of claim 1, wherein said ESD tie cell comprises a p-type transistor.

3. The integrated circuit of claim 2, wherein a gate of said p-type transistor is coupled to said ESD control line.

4. The integrated circuit of claim 1, wherein said ESD tie cell comprises a silicon controlled rectifier (SCR).

5. The integrated circuit of claim 4, wherein said SCR comprises a PMOS-triggered SCR (PSCR).

6. The integrated circuit of claim 5, wherein a gate of said PSCR is coupled to said ESD control line.

7. The integrated circuit of claim 1, wherein said first ESD device comprises an RC shunt.

8. The integrated circuit of claim 7, wherein said RC shunt comprises:
   a shunt resistor having a first node coupled to said first positive voltage rail;
   a shunt capacitor having (i) a first node coupled to said ESD control line and (ii) a second node coupled to said first negative voltage rail;
   an inverter having an input coupled to said ESD control line;
   a shunt transistor having (i) a gate coupled to an output of said inverter, (ii) a first source/drain coupled to said first positive voltage rail, and (iii) a second source/drain coupled to said first negative voltage rail.

9. The integrated circuit of claim 8, wherein said shunt transistor comprises an NMOS transistor having a total device width of at least 1000 µm.

10. The integrated circuit of claim 8, wherein said shunt resistor and said shunt capacitor have an RC delay of between 1 and 5 ps.

11. The integrated circuit of claim 1, wherein said second circuit comprises a power pad coupled to said second positive voltage rail, (ii) a ground pad coupled to said second negative voltage rail, and (iii) the second I/O pad.

12. The integrated circuit of claim 1, wherein said first circuit comprises (i) a power terminal coupled to said first positive voltage rail, (ii) a ground terminal coupled to said first negative voltage rail, and (iii) said first I/O pad.

13. A method of protecting an integrated circuit from an electrostatic discharge event, wherein said integrated circuit comprises (i) a first electrostatic discharge (ESD) circuit coupled to a first positive voltage rail and a first negative voltage rail, (ii) a second ESD circuit coupled to a second positive voltage rail and a second negative voltage rail, (iii) a third ESD circuit coupled to a first input/output (I/O) pad, a first I/O circuit, and the first negative voltage rail, and (iv) a fourth ESD circuit coupled to a second input/output (I/O) pad, a second I/O circuit, and the second negative voltage rail, said method comprising:
   producing an ESD control signal on an ESD control line when an electrostatic discharge occurs on said first positive voltage rail, said second positive voltage rail, said first input/output (I/O) pad, or said second input/output (I/O) pad;
   closing a switch between said first positive voltage rail and said second positive voltage rail in response to said ESD control signal;
   shunting an ESD current from said first positive voltage rail to said first negative voltage rail through said first ESD circuit in response to said ESD control signal;
   shunting additional ESD current from said first input/output (I/O) pad to said first negative voltage rail through said third ESD circuit in response to said ESD control signal;
   shunting said ESD current from said second positive voltage rail to said second negative voltage rail through said second ESD circuit in response to said ESD control signal; and
   shunting additional ESD current from said second input/output (I/O) pad to said second negative voltage rail through said fourth ESD circuit in response to said ESD control signal.

14. The method of claim 13, wherein said switch comprises a p-type transistor.

15. The method of claim 14, wherein a gate of said p-type transistor is coupled to said ESD control line.

16. The method of claim 13, wherein said switch comprises a silicon controlled rectifier (SCR).

17. The method of claim 16, wherein said SCR comprises a PMOS-triggered SCR (PSCR).

18. The method of claim 17, wherein a gate of said PSCR is coupled to said ESD control line.

19. The method of claim 13, wherein producing said ESD control signal comprises detecting said ESD event across an RC shunt.

20. The method of claim 19, wherein said RC shunt comprises:

a shunt resistor coupled to said first positive voltage rail and to an intermediate node;

a shunt capacitor coupled to said first negative voltage rail and to said intermediate node;

an inverter having an input coupled to said intermediate node;

a shunt transistor having (i) a gate coupled to an output of said inverter, (ii) a first source/drain coupled to said first positive voltage rail, and (iii) a second source/drain coupled to said first negative voltage rail.

21. The method of claim 20, wherein producing said ESD control signal further comprises applying said intermediate node of said RC shunt to said ESD control line.

* * * * *